United States Patent
Zhu

(10) Patent No.: US 11,373,948 B2
(45) Date of Patent: Jun. 28, 2022

(54) INTERCONNECTION STRUCTURE AND METHOD OF MANUFACTURING THE SAME, AND ELECTRONIC DEVICE INCLUDING THE INTERCONNECTION STRUCTURE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/969,528

(22) PCT Filed: Apr. 13, 2018

(86) PCT No.: PCT/CN2018/083013
§ 371 (c)(1),
(2) Date: Aug. 12, 2020

(87) PCT Pub. No.: WO2019/157775
PCT Pub. Date: Aug. 22, 2019

(65) Prior Publication Data
US 2021/0005549 A1    Jan. 7, 2021

(30) Foreign Application Priority Data
Feb. 13, 2018  (CN) .......................... 201810149531.5

(51) Int. Cl.
*H01L 23/522*    (2006.01)
*H01L 21/768*    (2006.01)
*H01L 23/532*    (2006.01)

(52) U.S. Cl.
CPC ...... *H01L 23/5226* (2013.01); *H01L 21/7682* (2013.01); *H01L 21/76885* (2013.01); *H01L 23/53204* (2013.01)

(58) Field of Classification Search
CPC ........... H01L 23/5226; H01L 23/53204; H01L 21/7682; H01L 21/76885
(Continued)

(56) References Cited

U.S. PATENT DOCUMENTS

| 2004/0266179 | A1  | 12/2004 | Sharma |              |
|--------------|-----|---------|--------|--------------|
| 2017/0117223 | A1* | 4/2017  | Azmat  | H01L 21/823814 |
| 2018/0005703 | A1* | 1/2018  | Chung  | H01L 27/224  |

FOREIGN PATENT DOCUMENTS

| CN | 102130129 A | 7/2011 |
|----|-------------|--------|
| CN | 102315218 A | 1/2012 |

(Continued)

OTHER PUBLICATIONS

International Search Report with English translation from PCT/CN2018/083013, dated Nov. 12, 2018, pp. 1-15.
(Continued)

*Primary Examiner* — Tu-Tu V Ho
(74) *Attorney, Agent, or Firm* — Haynes and Boone, LLP

(57) ABSTRACT

An interconnection structure and a method of manufacturing the same, and an electronic device including the interconnection structure are provided. According to an embodiment, the interconnection structure may comprise: a first interconnection line at a first level, comprising at least a first portion extending along a first direction; a second interconnection line at a second level higher than the first level, comprising at least a second portion extending along a second direction crossing the first direction; a via plug disposed between the first portion of the first interconnection line and the second portion of the second interconnection line, and configured to
(Continued)

electrically connect the first interconnection line and the second interconnection line, wherein the via plug comprises a first pair of sidewalls respectively extending substantially parallel to corresponding sidewalls of the first portion and a second pair of sidewalls respectively extending substantially parallel to corresponding sidewalls of the second portion.

19 Claims, 18 Drawing Sheets

(58) Field of Classification Search
USPC .......................................................... 257/774
See application file for complete search history.

(56) References Cited

FOREIGN PATENT DOCUMENTS

| CN | 105761235 A | 7/2016 |
|---|---|---|
| CN | 106876365 A | 6/2017 |
| JP | 2014170788 A | 9/2014 |

OTHER PUBLICATIONS

First Office Action with English translation from 201810149531.5, dated May 5, 2019, pp. 1-12.
Second Office Action with English translation from 201810149531.5, dated Oct. 31, 2019, pp. 1-8.

* cited by examiner

INTERCONNECTION STRUCTURE AND METHOD OF MANUFACTURING THE SAME, AND ELECTRONIC DEVICE INCLUDING THE INTERCONNECTION STRUCTURE

RELATED APPLICATIONS

This application is a 371 National Stage of International Patent Application No. PCT/CN2018/083013 filed 13 Apr. 2018, entitled "INTERCONNECTION STRUCTURE AND METHOD OF MANUFACTURING THE SAME, AND ELECTRONIC DEVICE INCLUDING THE INTERCONNECTION STRUCTURE," which claims priority to Chinese Patent Application No. 201810149531.5 filed 13 Feb. 2018, entitled "Bulk Handling," both of which are herein incorporated by reference in their entirety.

TECHNICAL FIELD

The present application generally relates to a field of integrated circuit manufacturing, and more specifically, to an interconnection structure and a method of manufacturing the same, and an electronic device including the interconnection structure.

BACKGROUND ART

As integration density of integrated circuits (ICs) becomes higher and higher, a space for manufacturing the interconnection structure becomes smaller and smaller, which makes manufacturing difficulty and resistance both increase. For example, an interconnection line is usually made of a conductive metal such as copper (Cu), aluminum (Al), cobalt (Co), or tungsten (W), etc. Because a line width is reduced, a grain size of metal becomes smaller, thus material properties, especially conductive properties, deteriorate. Moreover, when using a metal interconnection line, it is usually necessary to provide a diffusion barrier layer such as titanium nitride (TiN) or tantalum nitride (TaN), etc. However, thickness of the diffusion barrier layer may be relatively too thick in a small scale. Thus, this may cause a large resistance. In addition, due to alignment errors, it is necessary to increase spacing between interconnection lines, which increases production cost, and photoetching, etching, and filling of small-size contact holes are difficult.

SUMMARY

In view of this, an object of the present disclosure is at least in part to provide an interconnection structure having improved performance and/or manufacturing, a manufacturing method thereof, and an electronic device including the interconnection structure.

According to an aspect of the present disclosure, there is provided an interconnection structure comprising: a first interconnection line at a first level, comprising at least a first portion extending along a first direction; a second interconnection line at a second level higher than the first level, comprising at least a second portion extending along a second direction crossing the first direction; a via plug disposed between the first portion of the first interconnection line and the second portion of the second interconnection line, and configured to electrically connect the first interconnection line and the second interconnection line, wherein the via plug comprises a first pair of sidewalls respectively extending substantially parallel to corresponding sidewalls of the first portion and a second pair of sidewalls respectively extending substantially parallel to corresponding sidewalls of the second portion.

According to another aspect of the present disclosure, there is provided a method of manufacturing an interconnection structure, comprising: sequentially forming a first interconnection line material layer and a via plug material layer on an interlayer dielectric layer; patterning the via plug material layer and the first interconnection line material layer according to a layout of a first interconnection line, to form the first interconnection line from the first interconnection line material layer, wherein the first interconnection line comprises at least a first portion extending along a first direction; further raising the interlayer dielectric layer to be substantially at the same level with a top surface of the via plug material layer; forming a second interconnection line material layer on the interlayer dielectric layer; and patterning the second interconnection line material layer and the via plug material layer according to a layout of a second interconnection line, to form the second interconnection line from the second interconnection line material layer, wherein the second interconnection line comprises at least a second portion extending along a second direction crossing the first direction, such that a via plug is formed from the via plug material layer at a position where the first portion and the second portion intersect.

According to yet another aspect of the present disclosure, there is provided an electronic device including the above interconnection structure.

According to an embodiment of the present disclosure, the via plug is defined by the interconnection lines located above and below the via plug, thus is self-aligned to the interconnection lines above and below the via plug and electrically connects them to each other. Thus, misalignment can be avoided. In addition, the interconnection structure may include a compound of a metal element and a semiconductor element, such as metal silicide, germanide, or silicon-germanide. Using this material, a semiconductor material such as (polycrysalline or amorphous) silicon, germanium, silicon germanium, etc. which is easy for filling and patterning, may be used when manufacturing the interconnection structure. Moreover, with the same line width, the interconnection line made of metal silicide, germanide, silicon-germanide, etc. may have a smaller resistance compared to a thin metal line.

BRIEF DESCRIPTION OF DRAWINGS

The above and other objects, features and advantages of embodiments of the present disclosure will become more apparent with reference to the attached drawings, in which:

FIGS. 1 to 17(c) are schematic diagrams illustrating a flow of manufacturing an interconnection structure according to an embodiment of the present disclosure, in which:

FIGS. 1, 2, 3, 4(a), 5 are cross-sectional views;

FIGS. 6(b) and 7 are cross-sectional views taken along line B-B' in FIG. 6(a);

FIG. 13 is a cross-sectional view taken along line C-C' in FIG. 12(a);

FIG. 17(c) is a cross-sectional view taken along line D-D' in FIG. 14(a).

FIGS. 18(a), 18(b) and 18(c) are schematic diagrams of an interconnection structure according to another embodiment of the present disclosure, in which:

FIG. 18(a) is a cross-sectional view taken along line B-B' in FIG. 14(a);

FIG. 18(b) is a cross-sectional view taken along line C-C' in FIG. 12(a); and

FIG. 18(c) is a cross-sectional view taken along line D-D' in FIG. 14(a).

Throughout the drawings, the same or similar reference numerals indicate the same or similar components.

DETAILED DESCRIPTION

Figure 1:
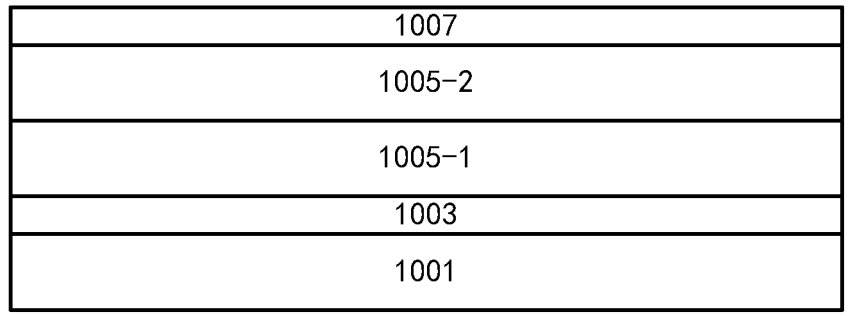

Hereinafter, embodiments of the present disclosure will be described in detail with reference to the accompanying drawings. It should be understood, however, that the description is only illustrative, and is not intended to limit the scope of the disclosure. In addition, descriptions of well-known structures and techniques are omitted in the following description in order to avoid unnecessarily obscuring the concept of the present disclosure.

Various structural schematic diagrams according to embodiments of the present disclosure are shown in the drawings. These drawings are not drawn to scale, and some details have been enlarged and some details may be omitted for the purpose of clarity. Shapes of various regions and layers shown in the drawings, as well as their relative sizes and positional relationships, are only exemplary, and may be deviated due to manufacturing tolerances or technical limitations in practice. Areas/layers with different shapes, sizes and relative positions can be additionally designed by those skilled in the art according to actual requirements.

In the context of the disclosure, when a layer/element is referred to as being "on" another layer/element, the layer/element may be directly on another layer/element, or there may be an intervening layer/element therebetween. In addition, if a layer/element is "above" another layer/element in one orientation, then when the orientation is reversed, the layer/element may be "below" another layer/element.

According to an embodiment of the present disclosure, instead of a conventional technique such as a Damascus process by which a slot or hole is formed in an interlayer insulating layer and then filled with a conductive material such as a metal to form an interconnection structure, a layer of preliminary material is first formed and patterned into a desired shape (for example, a line shape for forming an interconnection line or a block shape for forming a via plug), and then the interlayer insulating layer is formed to fill a gap between the interconnection structures. In this way, difficulties in opening a hole and filling may be avoided. In addition, patterning of the via plug may be based on a pattern of its upper and lower interconnection lines, so that a patterned via plug may be self-aligned to its upper and lower interconnection lines.

More specifically, a first interconnection line material layer and a via plug material layer may be sequentially formed on the interlayer dielectric layer. Then, the via plug material layer and the first interconnection line material layer may be patterned according to a layout of a first interconnection line (hereinafter referred to as "first patterning"), so that the first interconnection line is formed by the first interconnection line material layer. For example, the first interconnection line may include at least a first portion extending along a first direction. Therefore, the via plug material layer is patterned into the same or substantially the same shape as the first interconnection line, and may include sidewalls extending parallel or substantially parallel to (e.g., approximately coplanar with) corresponding sidewalls of the first interconnection line.

Then, the interlayer dielectric layer may be further raised to be substantially at the same level of a top surface of the via plug material layer, and a second interconnection line material layer may be formed on the interlayer dielectric layer. The second interconnection line material layer and the via plug material layer may be patterned according to a layout of a second interconnection line (hereinafter referred to as "second patterning"), so that the second interconnection line is formed by the second interconnection line material layer. For example, the second interconnection line includes at least a second portion extending along a second direction crossing the first direction. The first interconnection line (e.g., the first portion thereof) and the second interconnection line (e.g., the second portion thereof) may overlap in a vertical direction so as to form an electrical connection there between. In the second patterning, the via plug material layer extending like the first interconnection line is split into the via plug at an intersection portion of the first interconnection line and the second interconnection line. In addition to the sidewalls defined by the first interconnection line described above, the via plug also includes sidewalls that extend parallel or substantially parallel (e.g., approximately coplanar) to the corresponding sidewalls of the second interconnection line.

As described above, a pair of sidewalls of the via plug is defined by the first patterning, and another pair of sidewalls of the via plug is defined by the second patterning. Thus, the via plug is defined by the intersection portion of the first interconnection line and the second interconnection line, and is therefore self-aligned to the intersection portion of the first interconnection line and the second interconnection line.

There may be a plurality of intersection portions between the first interconnection line and the second interconnection line, or one or more first interconnection lines (e.g., parallel to each other) and/or one or more second interconnection lines (e.g., parallel to each other) may be formed, thereby resulting in a plurality of intersection portions. According to the above process, the via plug forms at each intersection portion. According to a design of the layout, some of the via plugs may be selectively removed, and the via plug at a position where the electrical connection is really needed remains. A gap created due to the removal of the via plug may then be filled by the interlayer dielectric layer or low-k dielectric material, or may be at least partially kept (resulting in a gap or air gap in the interlayer dielectric layer) to reduce the capacitance between the interconnection lines.

The layers in the interconnection structure may be made of conductive materials such as metals (e.g., Cu, Al, Co, W, etc.). According to an embodiment of the present disclosure, at least one of the (first and/or second) interconnection line material layers and the via plug material layer may include a semiconductor material. This is advantageous for the forming and patterning of material layers. There may be an etching selectivity between two adjacent layers to facilitate patterning.

For example, the first interconnection line material layer may include a first semiconductor material, and the via plug material layer may include a second semiconductor material with an etching selectivity with respect to the first semiconductor material (e.g., a different material). In the first patterning, the via plug material layer located above may be patterned first, and then a protective layer may be formed on the surface of the patterned via plug material layer, and then the first interconnection line material layer may be patterned. For the patterned first interconnection line material layer, the first semiconductor material therein may be converted into a low-resistance material (for example, by reacting with metal (e.g., silicidation reaction) to generate a low-resistance metal semiconductor compound (e.g., metal silicide)) to form the first interconnection line. Due to the presence of the protective layer, the via plug material layer of the second semiconductor material may be maintained, so as to be further patterned in the second patterning. Certainly, if a compound generated by the second semiconductor material reacting with the metal is easily etched later and has an etching selectivity with respect to its adjacent layers, the protective layer may not be formed. A third interconnection line material layer may include a third semiconductor material (which may be the same as or different from the first semiconductor material) having an etching selectivity with respect to the second semiconductor material (e.g., a different material). In the second patterning, the third interconnection line material layer and the via plug material layer (which has been partially patterned by the first patterning) may be patterned in sequence. The patterned third interconnection line material layer and via plug material layer may be converted into low resistance materials to form the third interconnection line and via plug, respectively.

According to an embodiment of the present disclosure, there is provided an interconnection structure in which a via plug between two layers of interconnection lines for electrically connecting the two layers of interconnection lines is self-aligned to the two layers of interconnection lines. For example, the interconnection structure may include a first interconnection line at a first level and a second interconnection line at a different second level (e.g., higher than the first level). There may be intersection portions between the first interconnection line and the second interconnection line. The interconnection structure may further include the via plug which is self-aligned to the intersection portion of the first interconnection line and the second interconnection line.

As described above, this is because the via plug is defined by the first patterning for patterning the first interconnection line and the second patterning for patterning the second interconnection line. A pair of sidewalls of the via plug (defined by the first patterning) may extend substantially parallel to or even coplanar with corresponding sidewalls of the first interconnection line, and another pair of sidewalls (defined by the second patterning) may extend substantially parallel to or even coplanar with corresponding sidewalls of the second interconnection line. Due to the self-alignment, in a top view, the intersection portion of the first interconnection line and the second interconnection line and the corresponding via plug may be substantially coincident. For example, they may be substantially center-aligned.

Technology of the present disclosure may be presented in various forms, some of which will be described below.

An example flow of manufacturing an interconnection structure according to an embodiment of the present disclosure will be described below with reference to FIGS. 1 to 17(c).

As shown in FIG. 1, a substrate 1001 may be provided. The substrate 1001 may be various forms of substrates, including but not limited to bulk semiconductor material substrate such as bulk silicon (Si) substrate, semiconductor-on-insulator (SOI) substrate, compound semiconductor substrate such as silicon germanium (SiGe) substrate, etc. In the following description, for convenience of explanation, the bulk Si substrate is taken as an example for description.

In or on the substrate 1001, various devices may be formed through an integrated circuit (IC) manufacturing process, for example, active device such as field effect transistor (FET) and passive device such as capacitor, resistor, etc. These devices may, for example, be arranged according to a layout of the IC, and need to be interconnected with each other through an interconnection structure.

An interlayer dielectric layer 1003 may be formed on the substrate 1001. The interlayer dielectric layer 1003 may include a low-k dielectric material such as oxide (for example, silicon oxide). In the interlayer dielectric layer 1003, contact portions to terminals of at least a part of the devices (for example, a source/drain terminal, a gate terminal of the FET, etc.) may be formed. These contact portions may then be interconnected with each other according to a circuit design through the interconnection structure formed above the contact portions.

On the interlayer dielectric layer 1003, a first interconnection line material layer 1005-1 and a first via plug material layer 1005-2 may be formed sequentially by performing deposition such as chemical vapor deposition (CVD) or plasma enhanced (PECVD) or electron cyclotron resonance PECVD (ECR-PECVD), at a certain deposition temperature (for example, between about 250-750° C.). As described above, to facilitate material filling and patterning, the first interconnection line material layer 1005-1 and the first via plug material layer 1005-2 may include semiconductor materials having etching selectivity with respect to each other. For example, the first interconnection line material layer 1005-1 may include polycrystalline Si (or amorphous Si), and the first via plug material layer 1005-2 may include polycrystalline SiGe (or amorphous SiGe). Thicknesses of the first interconnection line material layer 1005-1 and the first via plug material layer 1005-2 may be determined according to a level of each layer in the interconnection structure, for example, determined to be about 10-100 nm, respectively. At least one of the first interconnection line material layer 1005-1 and the first via plug material layer 1005-2 may be doped, for example by in-situ doping during deposition or implant doping after deposition. According to another embodiment, the first interconnection line material layer 1005-1 may include other conductive materials such as metal, for example, tungsten (W), etc. Due to a larger area in the case of deposition, a resistance of tungsten is smaller compared to the case of filling a small gap, which is beneficial to reduce the resistance of the interconnection structure.

In addition, on the first via plug material layer 1005-2, a hard mask layer 1007 may be formed by, for example, deposition such as CVD. For example, the hard mask layer 1007 may include nitride (e.g., silicon nitride), and have a thickness of about 10-100 nm.

Figure 2:
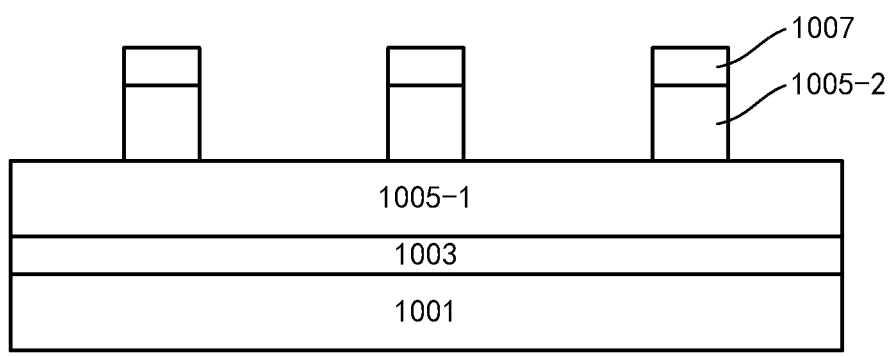

As shown in FIG. 2, according to a layout of a first interconnection line, the hard mask layer 1007 may be patterned (for example, reactive ion etching (RIE)) by photoetching process. Here, three first interconnection lines extending in parallel (along a direction perpendicular to paper surface) are shown. The layout of the interconnection line may be determined according to the circuit design, and is not limited to the specific example shown in the figure. For example, the interconnection lines of the same layer may extend in parallel or not in parallel, and the same interconnection line may extend along the same direction or may include a bended portion. Preferably, in the same layer, the interconnection lines may extend in parallel at least in a local area.

Then, the first via plug material layer 1005-2 is selectively etched, for example, by RIE. The etching may be stopped at the first interconnection line material layer 1005-1 below the first via plug material layer 1005-2. Thus, the first via plug material layer 1005-2 is patterned into a layout consistent with the layout of the first interconnection line. In principle, the first interconnection line material layer 1005-1 should be patterned together. However, in order to form a protective layer (which will be described in further detail below), the etching is stopped at the first interconnection line material layer 1005-1. Certainly, the first interconnection line material layer 1005-1 may be etched without forming the protective layer. According to another embodiment, when the first interconnection line material layer 1005-1 is made of a metal such as tungsten, the protective layer may be omitted, and the etching may be stopped at the interlayer dielectric layer 1003.

Figure 3:
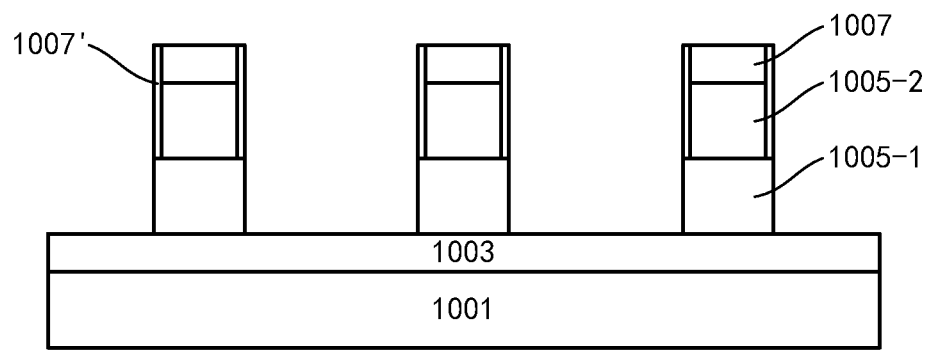

Next, as described above, the protective layer may be formed on surfaces of the patterned first via plug material layer 1005-2. Due to the presence of the hard mask layer 1007, the top surface of the first via plug material layer 1005-2 is protected. Thus, the protective layer may be further formed on sidewalls of the first via plug material layer 1005-2. For example, as shown in FIG. 3, a spacer 1007' may be formed on the sidewalls of the first via plug material layer 1005-2 by a spacer forming process. For example, a nitride layer with a thickness of about 1-5 nm may be deposited approximately conformally on the structure shown in FIG. 2, and the RIE is performed on the deposited nitride layer in a direction substantially perpendicular to the surface of the substrate, to remove its laterally extending portion and leave its vertically extending portion, thereby obtaining the spacer 1007' with the thickness of about 1-5 nm. In this example, both the spacer 1007' and the hard mask layer 1007 are made of nitrides, which are integrally shown as the protective layer (indicated by 1007') in the following drawings.

After the protective layer 1007' is formed, the first interconnection line material layer 1005-1 may be further patterned. Here, using the first via plug material layer 1005-2 (which has the layout of the first interconnection line), on surface of which the protective layer 1007' is formed, as a mask, the first interconnection line material layer 1005-1 is selectively etched, for example, by RIE. The etching may be stopped at the interlayer dielectric layer 1003. Thus, the first interconnection line material layer 1005-1 is patterned into its proper layout, that is, the layout of the first interconnection line.

Figure 4A:
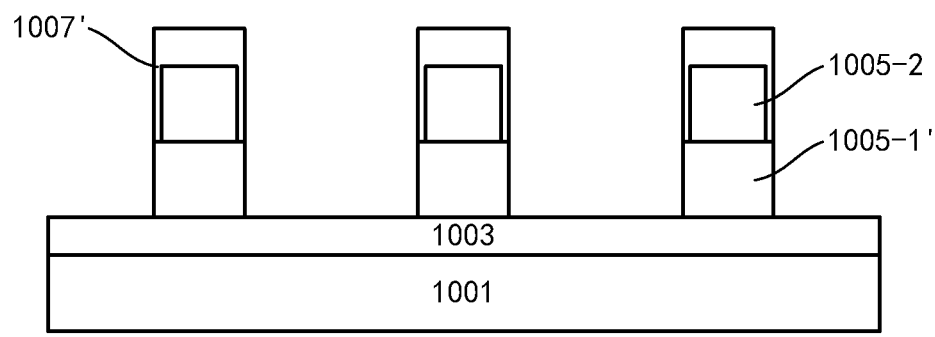
Figure 4B:
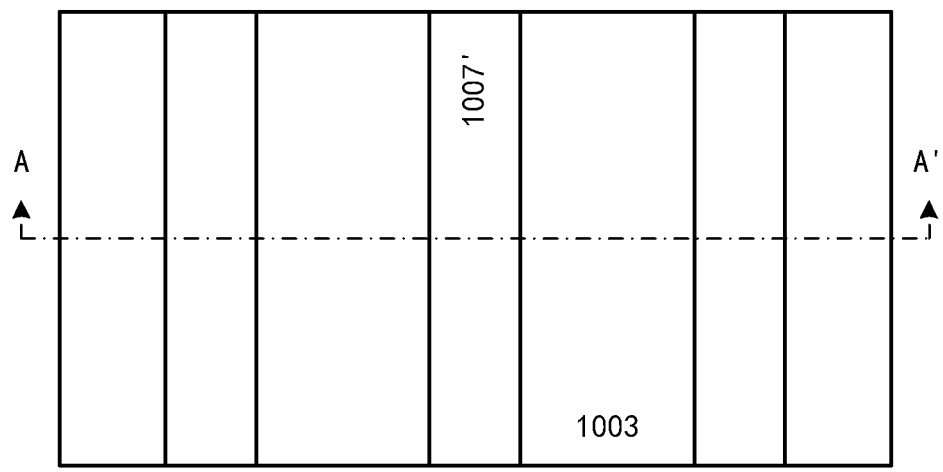
FIG. 4(b) is a top view, in which line A-A' shows a cutting position of the aforementioned cross-sectional views.

Thereafter, the first interconnection line material layer 1005-1 of semiconductor material may be converted into a low-resistance material so as to form the first interconnection line. For example, a metal layer capable of reacting with the semiconductor material (in this example, Si) of the first interconnection line material layer 1005-1 (for example, at least one of Ni, NiPt, Co, Ti, or Ru) may be formed on the structure shown in FIG. 3, for example, by deposition such as CVD or physical vapor deposition (PVD) or atomic layer epitaxy (ALE). Then, the formed metal layer reacts (by silicide reaction) with the first interconnection line material layer 1005-1, for example by heat treatment, thereby generating a low-resistance metal silicide (for example, NiSi). Then, unreacted remaining metal layer may be removed. The first interconnection line material layer 1005-1 may be, in whole or in part (for example, its surface portion), converted into the low-resistance metal silicide, thereby forming a conductive first interconnection line 1005-1', as shown in FIGS. 4(*a*) and 4(*b*). According to another embodiment, when the first interconnection line material layer 1005-1 is made of a metal such as tungsten, this step may be omitted.

Then, the protective layer 1007' may be removed by selectively etching to expose the first via plug material layer 1005-2, so as to be further patterned later. In the absence of the protective layer (for example, when the first interconnection line material layer 1005-1 is made of a metal such as tungsten), this step may be omitted.

Figure 5:
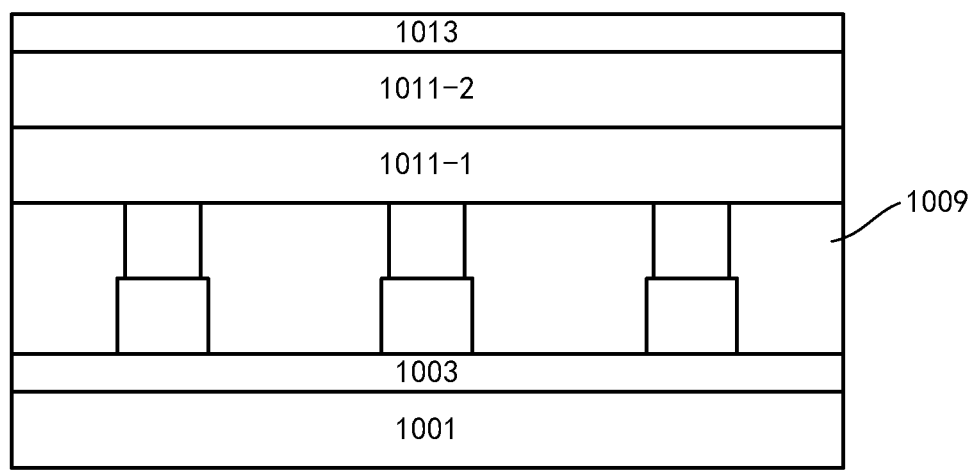

The interlayer dielectric layer may be further raised to bury the formed first interconnection line 1005-1' and the first via plug material layer 1005-2, so as to form an interconnection structure with more layers. For example, as shown in FIG. 5, another interlayer dielectric layer 1009 may be formed on the interlayer dielectric layer 1003, for example, by deposition. For example, the interlayer dielectric layer 1009 may include the low-k dielectric material such as oxide (therefore, it may include the same material as the interlayer dielectric layer 1003 and thus be integrated therewith). Planarization process such as chemical mechanical polishing (CMP) may be performed on the interlayer dielectric layer 1009, and the CMP may be stopped at the first via plug material layer 1005-2.

Next, a process similar as described above in connection with FIGS. 1 to 4(*b*) may be used to further manufacture more interconnection lines and contact plugs.

For example, on the interlayer dielectric layer 1009, a second interconnection line material layer 1011-1 and a second via plug material layer 1011-2 may be formed sequentially by performing deposition such as CVD or PECVD or ECR-PECVD, at a certain deposition temperature (for example, between about 250-750° C.). Each of the second interconnection line material layer 1011-1 and the second via plug material layer 1011-2 may include a semiconductor material having etching selectivity with respect to its adjacent layer. For example, the second interconnection line material layer 1011-1 may include polycrystalline Si (or amorphous Si), and the second via plug material layer 1011-2 may include polycrystalline SiGe (or amorphous SiGe). Thicknesses of the second interconnection line material layer 1011-1 and the second via plug material layer 1011-2 may be determined according to a level of each of the layers in the interconnection structure, for example, determined to be about 10-100 nm, respectively. At least one of the second interconnection line material layer 1011-1 and the second via plug material layer 1011-2 may be doped. On the second via plug material layer 1011-2, for example, a hard mask layer 1013 having a thickness of about 10-100 nm and a material of nitride may be formed. According to another embodiment, the second interconnection line material layer 1011-1 may include metal, for example, tungsten, etc. Due to a larger area in the case of deposition, the resistance of tungsten is smaller compared to the case of filling a small gap, which is beneficial to reduce the resistance of the interconnection structure.

The second interconnection line material layer 1011-1 and the second via plug material layer 1011-2 may be patterned according to the above process.

Figure 6A:
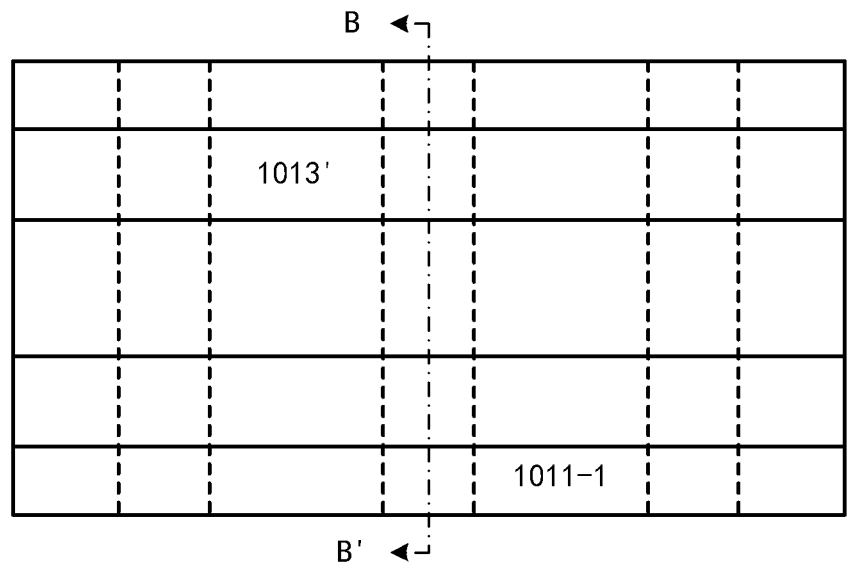
FIG. 6(a) is a top view.
Figure 6B:
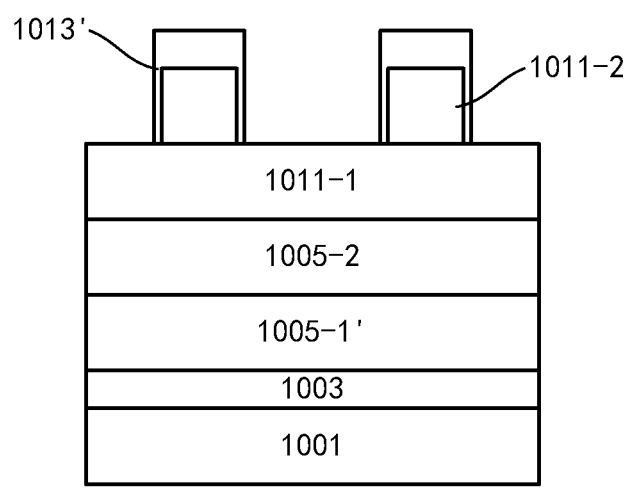

Specifically, according to a layout of second interconnection line, the hard mask layer 1013 may be patterned (for example, RIE) by photoetching process. Here, interconnection lines in adjacent layers may extend at least partially in directions intersecting with each other in order to achieve two-dimensional routing on a plane. For example, as shown in FIGS. 6(*a*) and 6(*b*), the first interconnection lines formed as described above may (at least partially) extend along a direction that is approximately vertical, and the second interconnection lines may (at least partially) extend along a direction that is approximately horizontal.

Then, the second via plug material layer 1011-2 is selectively etched, for example, by RIE. The etching may be stopped at the second interconnection line material layer 1011-1 below the second via plug material layer 1011-2. Thus, the second via plug material layer 1011-2 is patterned into a layout consistent with the layout of the second interconnection line. Similarly, a protective layer 1013' may be formed on a surface of the patterned second via plug material layer 1011-2. As described above, according to another embodiment, when the second interconnection line material layer 1011-1 is made of a metal such as tungsten, the protective layer may be omitted, and the etching may be stopped at the interlayer dielectric layer 1009.

Figure 7:
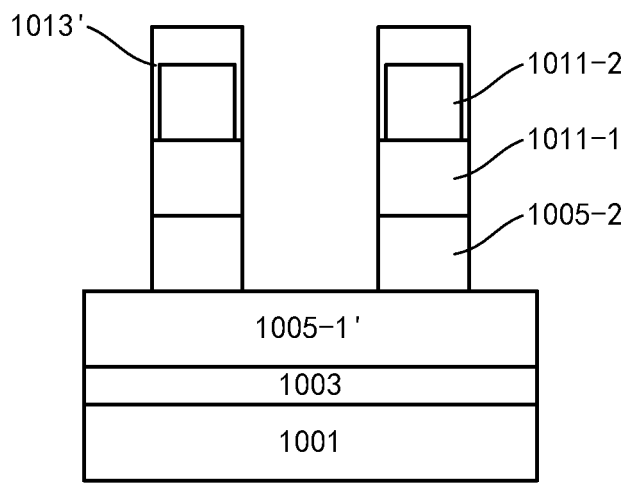

Next, as shown in FIG. 7, using the second via plug material layer 1011-2 (which has the layout of the second interconnection line), on surface of which the protective layer 1013' is formed, as a mask, the second interconnection line material layer 1011-1 and the first via plug material layer 1005-2 (which has the layout of the first interconnection line) are selectively etched in sequence, for example, by RIE. The etching may be stopped at the first interconnection line 1005-1'.

Thus, the second interconnection line material layer 1011-1 is patterned into its proper layout, that is, the layout of the second interconnection line. In addition, since the etching is performed twice according to the layout of the first interconnection line and the layout of the second interconnection line, the first via plug material layer 1005-2 now only remains at intersection portions of the first interconnection lines and the second interconnection lines, and a remaining portion of the first via plug material layer 1005-2 is self-aligned to the intersection portions of the first interconnection lines and the second interconnection lines. Moreover, at each of the intersection portions of the first interconnection lines and the second interconnection lines, there is a remaining portion of the first via plug material layer 1005-2. At least some of these remaining portions may be selectively removed according to a circuit design.

Figure 8A:
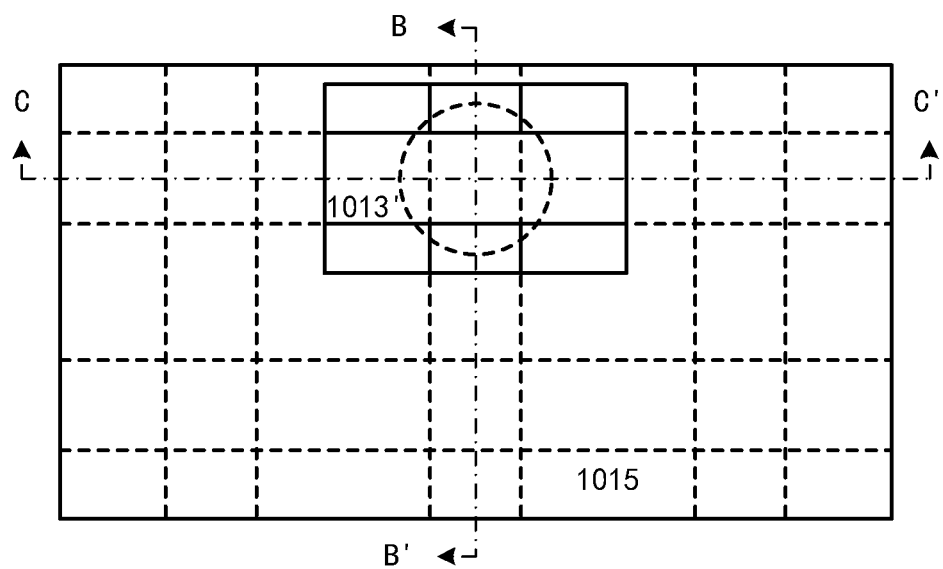
FIG. 8(a) is a top view.
Figure 8B:
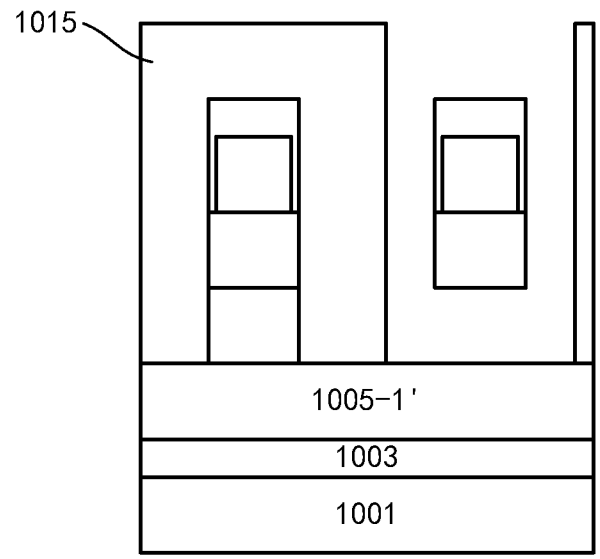
FIG. 8(b) is a cross-sectional view taken along line B-B' in FIG. 8(a)
Figure 8C:
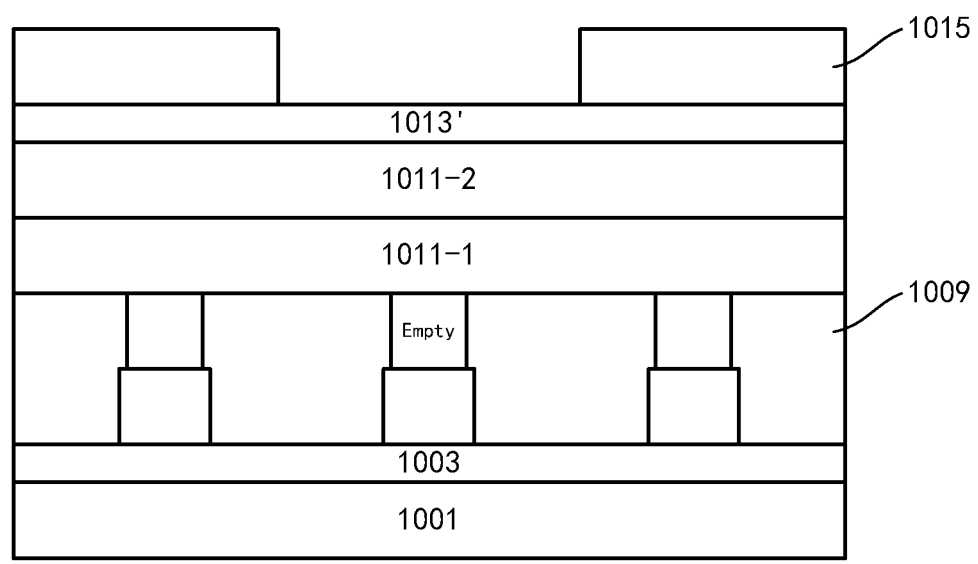
FIG. 8(c) is a cross-sectional view taken along line C-C' in FIG. 8(a)

For example, as shown in FIGS. 8(*a*), 8(*b*), and 8(*c*), a masking layer 1015 may be formed on the structure shown in FIG. 7 (for example, a photoresist or a hard mask formed by patterning a film made of silicon nitride which is a dielectric material), and the masking layer 1015 is patterned, for example, by photoetching to mask areas corresponding to remaining portions of the first via plug material layer need to be kept, and to expose areas corresponding to remaining portions of the first via plug material layer need to be removed. In this example, two horizontal and three vertical interconnection lines and six intersections therebetween are shown. As mentioned above, remaining portions of the first via plug material layer are present at these six intersection portions. For example, the remaining portion at a position indicated by the dashed circle in FIG. 8(*a*) should be removed according to the circuit design. Accordingly, the masking layer 1015 may be opened at this position. Certainly, this is only an example, and it may be necessary to remove more remaining portions, or it may not be necessary to remove the remaining portion, which is determined by a connection relationship between the first interconnection lines and the second interconnection lines in the circuit design.

The first via plug material layer 1005-2 may be selectively etched through the opening in the masking layer 1015. For example, the first via plug material layer 1005-2 may be selectively etched by using an etching agent which is able to etch the first via plug material layer 1005-2 (in the example, SiGe) without affecting or substantially not affecting the first interconnection lines 1005-1' (which has been converted into the low-resistance material) and the second interconnection line material layer 1011-1 (in the example, Si) (at this time, the second via plug material layer 1011-2 is protected by the protective layer 1013'). Thus, the remaining portion of the first via plug material layer 1005-2 at the opening in the masking layer 1015 may be removed. According to another embodiment, if the first interconnection line material layer 1005-1 and the second interconnection line material layer 1011-1 are made of metal such as tungsten, the first via plug material layer 1005-2 may be selectively etched, for example, by Si isotropic etching which etches Si or SiGe quickly, and etches a metal such as tungsten slowly.

Thereafter, the masking layer 1015 may be removed.

Then, as described above in connection with FIGS. 4(*a*) and 4(*b*), the remaining portions of the first via plug material layer 1005-2 and the second interconnection line material layer 1011-1 may be converted into the low-resistance material (for example, a compound of metals and semiconductor elements such as silicide (for example, NiSi) or silicon-germanide (for example, NiSiGe)), thereby forming a conductive via plug 1005-2' and a second interconnection line 1011-1'. In another embodiment, if the first interconnection line material layer 1005-1 and the second interconnection line material layer 1011-1 are made of metal such as tungsten, it is also possible to use conventional methods for forming silicide and silicon-germanide, and then remove unreacted metals. For example, wet etching (for example, dilute aqua regia which etches Ni quickly, and etches tungsten slowly) may be used to remove Ni that has not undergone silicon or silicon germanium reaction.

Figure 9A:
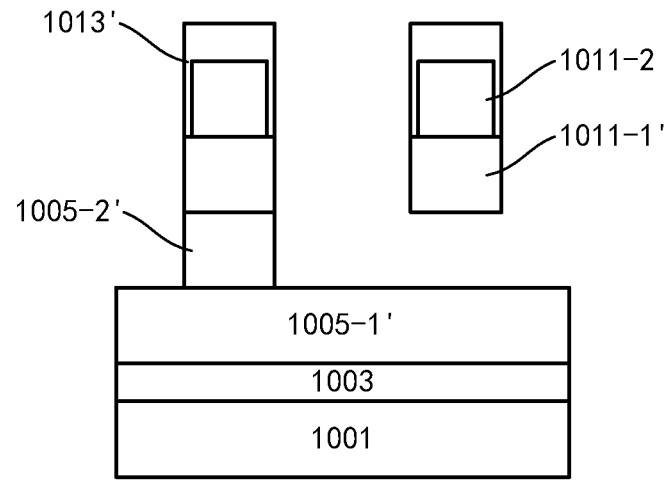
FIGS. 9(a), 10(a), 11(a) are cross-sectional views taken along line B-B' in FIG. 8(a)
Figure 9B:
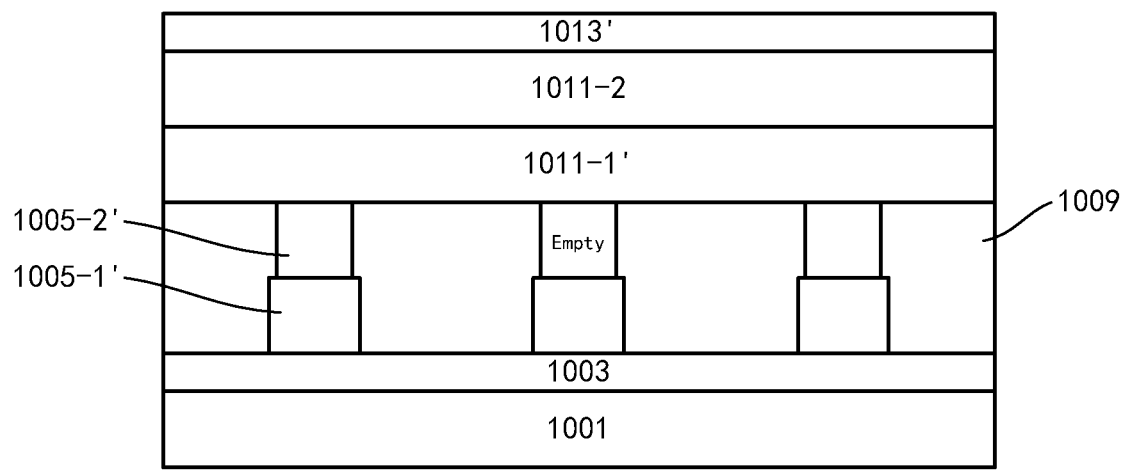
FIGS. 9(b), 10(b), 11(b) are cross-sectional views taken along line C-C' in FIG. 8(a)

As shown in FIG. 9(*a*), a pair of sidewalls of the via plug 1005-2' may be defined by corresponding sidewalls of the second interconnection line 1011-1' (e.g., extending approximately in parallel thereto, or even approximately in coplanar therewith). And as shown in FIG. 9(*b*), another pair of sidewalls of the via plug 1005-2' may be defined by corresponding sidewalls of the first interconnection line 1005-1' (e.g., extending approximately in parallel thereto with slight recession due to the protective layer, and even approximately in coplanar therewith if there is no protective layer). This via plug 1005-2' is self-aligned to the intersection portion of the first interconnection line 1005-1' and the second interconnection line 1011-1', and electrically connects the first interconnection line 1005-1' and the second interconnection line 1011-1' to each other.

Figure 10A:
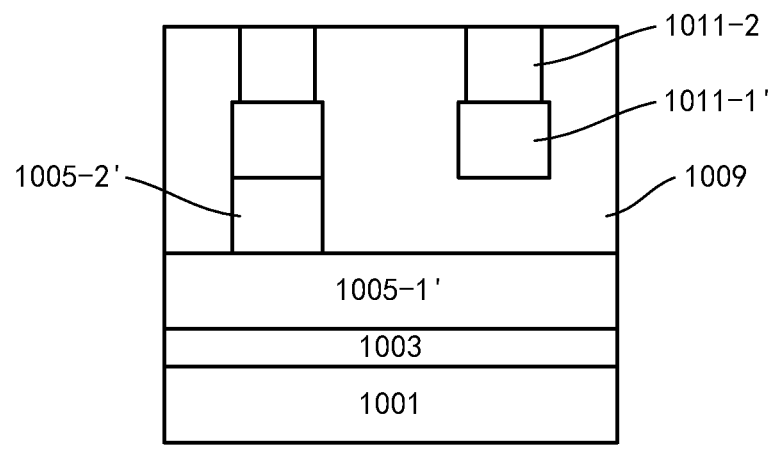
Figure 10B:
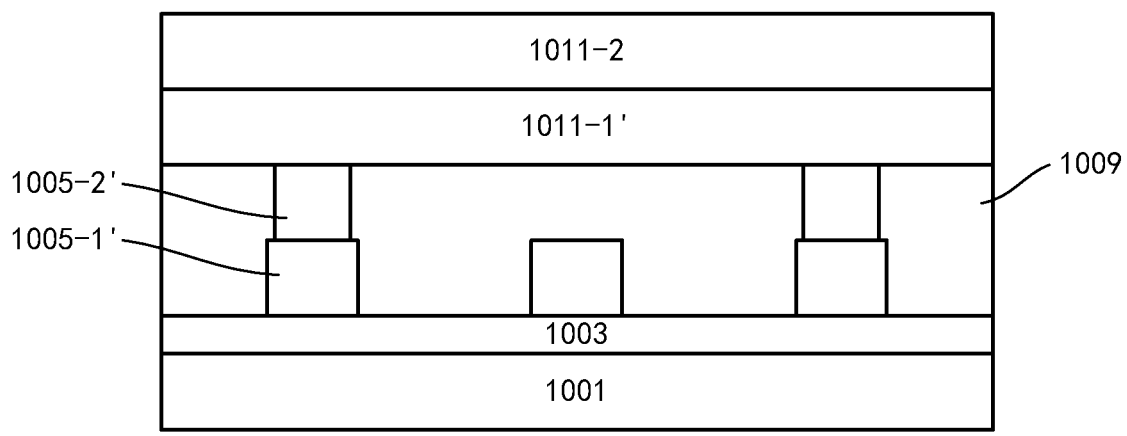
Figure 11A:
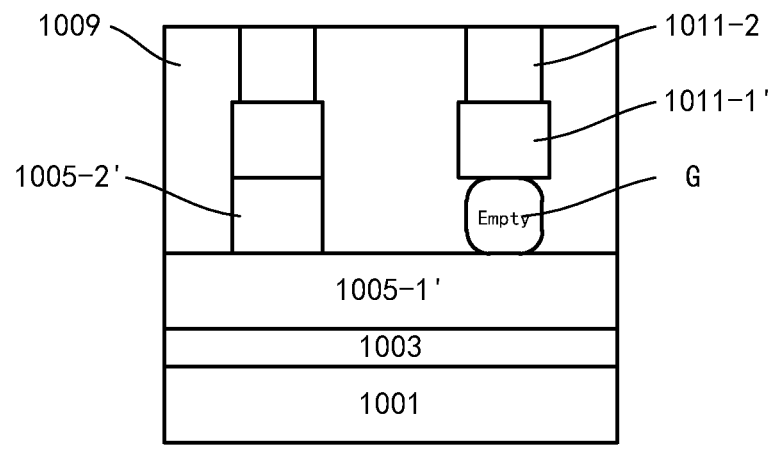
Figure 11B:
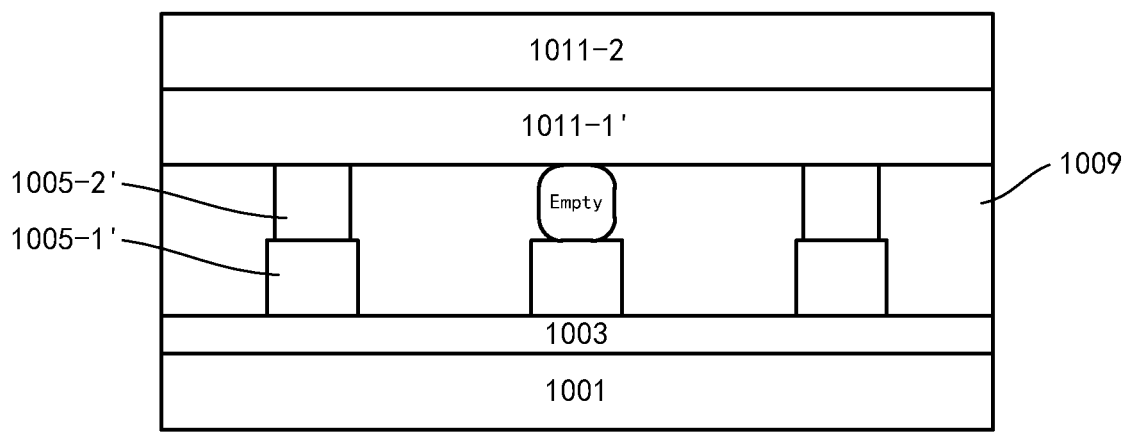

The interlayer dielectric layer may be further raised to bury the formed interconnection line and via plug, so as to form the interconnection structure with more layers. For example, as shown in FIGS. 10(*a*) and 10(*b*), the protective layer 1013' may be removed, and then the interlayer dielectric layer 1009 may be raised by, for example, depositing the low-k dielectric material such as oxide (which may be the same material as the interlayer dielectric layer 1009 and thus be integrated therewith). Planarization process such as CMP may be performed on the interlayer dielectric layer 1009, and the CMP may be stopped at the second via plug material layer 1011-2. The interlayer dielectric layer 1009 may fill a space generated due to, for example, selective removal of the via plug.

According to another embodiment of the present disclosure, as shown in FIGS. 11(*a*) and 11(*b*), the deposition of the interlayer dielectric layer 1009 may be controlled so that the interlayer dielectric layer 1009 does not completely fill gaps at positions at which the first interconnection lines and the second interconnection lines intersect. For example, the deposition may be performed by CVD or high density plasma (HDP), and the deposition is controlled to be mainly performed in the vertical direction. Thus, a gap or air gap G may be generated at a position at which the first interconnection line and the second interconnection line intersect. Similarly, the gap G may be self-aligned to the position at which the first interconnection line and the second interconnection line intersect. This helps reduce (parasitic) capacitance between the interconnection lines. According to another embodiment, the low-k dielectric material may be filled in the gap at the position at which the first interconnection line and the second interconnection line intersect.

Figure 12A:
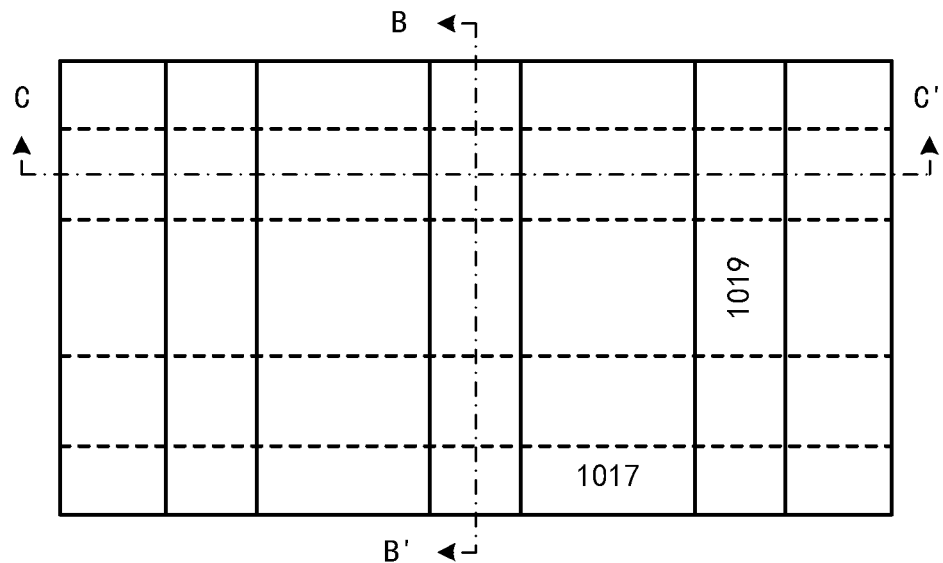
FIG. 12(a) is a top view.
Figure 12B:
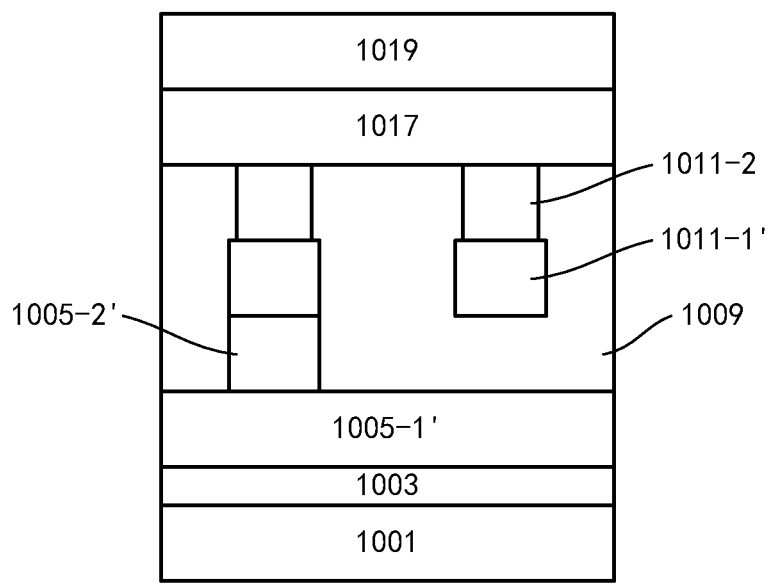
FIG. 12(b) is a cross-sectional view taken along line B-B' in FIG. 12(a)
Figure 12C:
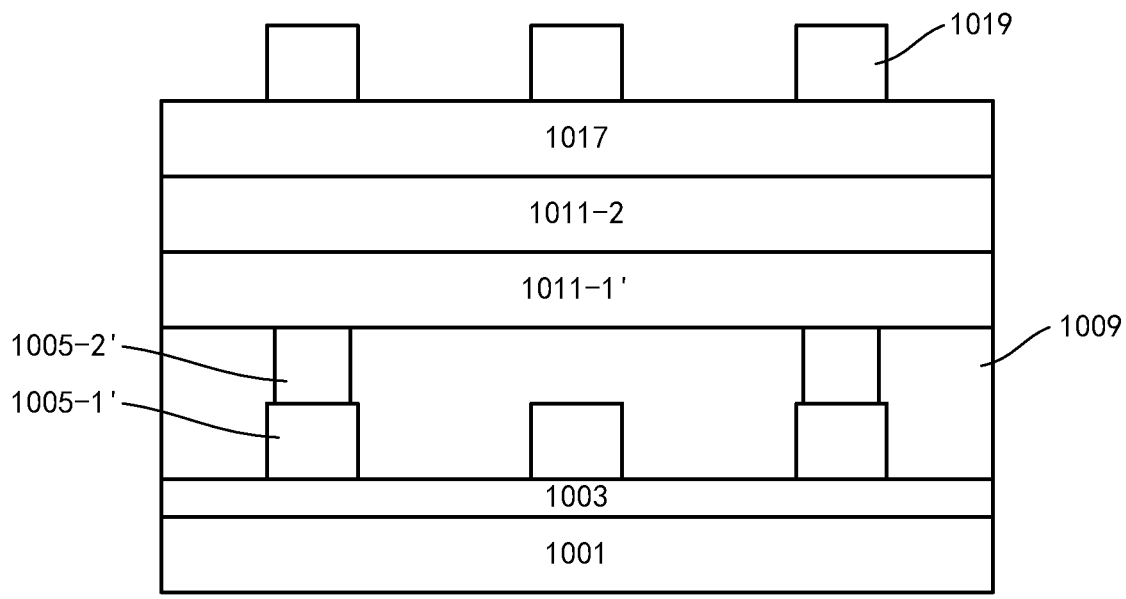
FIG. 12(c) is a cross-sectional view taken along line C-C' in FIG. 12(a)

As shown in FIGS. 12(*a*), 12(*b*), and 12(*c*), on the interlayer dielectric layer 1009, a third interconnection line material layer 1017 may be formed by, for example, performing deposition such as CVD, PECDV, or ECR-PECVD. The third interconnection line material layer 1017 may also include a semiconductor material having an etching selectivity with respect to its adjacent layer, such as polycrystalline Si (or amorphous Si). On the third interconnection line material layer 1017, a photoresist 1019 for patterning the third interconnection line material layer 1017 (or a hard mask formed by patterning a film made of silicon nitride which is a dielectric material) may be formed. For example, the photoresist 1019 is photoetched into a layout of the third interconnection line. In this example, as shown in FIG. 12(*a*), the layout of the third interconnection line is the same as the layout of the first interconnection line in the illustrated portion. However, the present disclosure is not limited thereto, and the components of the third interconnection lines may be determined according to the circuit design. According to another embodiment, the third interconnection line material layer 1017 may also include a metal having an etching selectivity with respect to its adjacent layer, such as tungsten.

Figure 13:
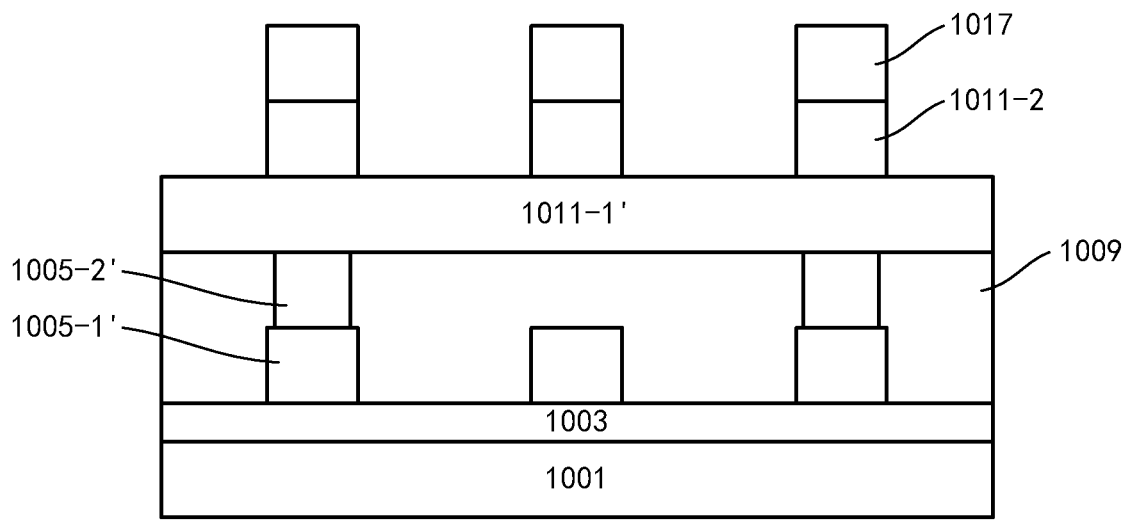

As shown in FIG. 13, using the photoresist 1019 as a mask, the third interconnection line material layer 1017 and the second via plug material layer 1011-2 (which has the layout of the second interconnection line) are selectively etched in sequence, for example, by RIE. The etching may be stopped at the second interconnection line 1011-1'. Then, the photoresist 1019 may be removed. According to an embodiment, the interlayer dielectric layer 1009 may also be etched back, especially to remove portions at the same level as the second via plug material layer 1011-2 to facilitate subsequent film deposition.

Thus, the third interconnection line material layer 1017 is patterned into its proper layout, that is, the layout of the third interconnection line. In addition, since the etching is performed twice according to the layout of the second interconnection line and the layout of the third interconnection line, the second via plug material layer 1011-2 now only remains at intersection portions of the second interconnection lines and the third interconnection lines, and remaining portions of the second via plug material layer 1011-2 are self-aligned to the intersection portions of the second interconnection lines and the third interconnection lines. Moreover, a remaining portion of the second via plug material layer 1011-2 is present at each of the intersection portions of the second interconnection lines and the third interconnection lines. At least some of these remaining portions may be selectively removed according to the circuit design.

Figure 14A:
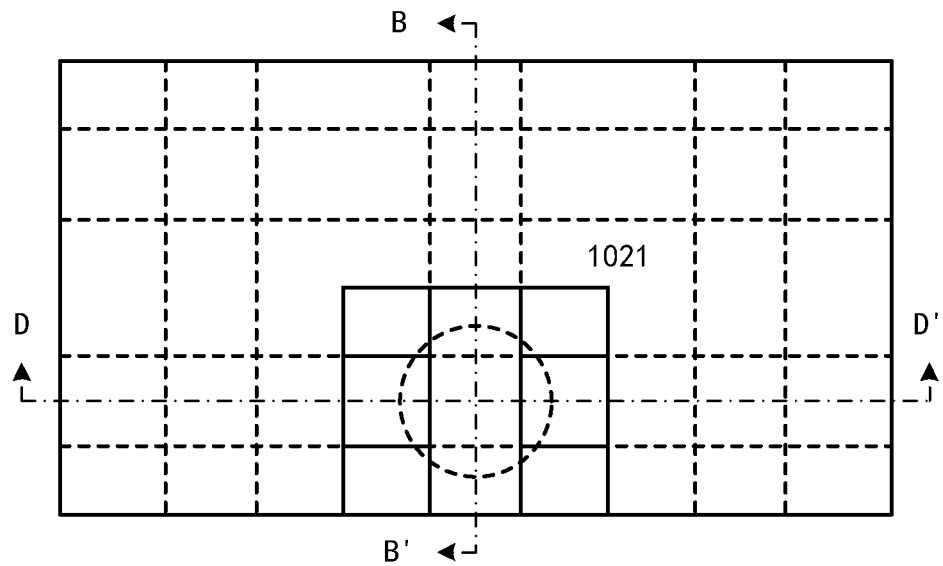
FIG. 14(a) is a top view.
Figure 14B:
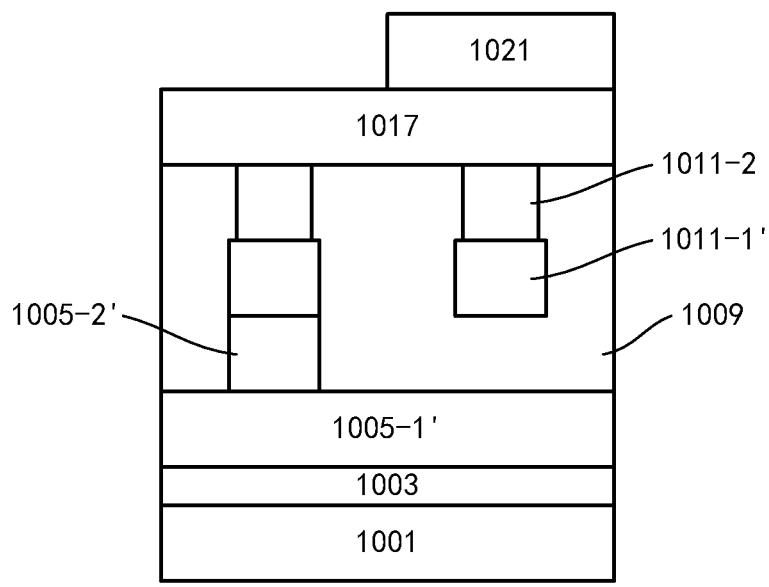
FIG. 14(b) is a cross-sectional view taken along line B-B' in FIG. 14(a)
Figure 14C:
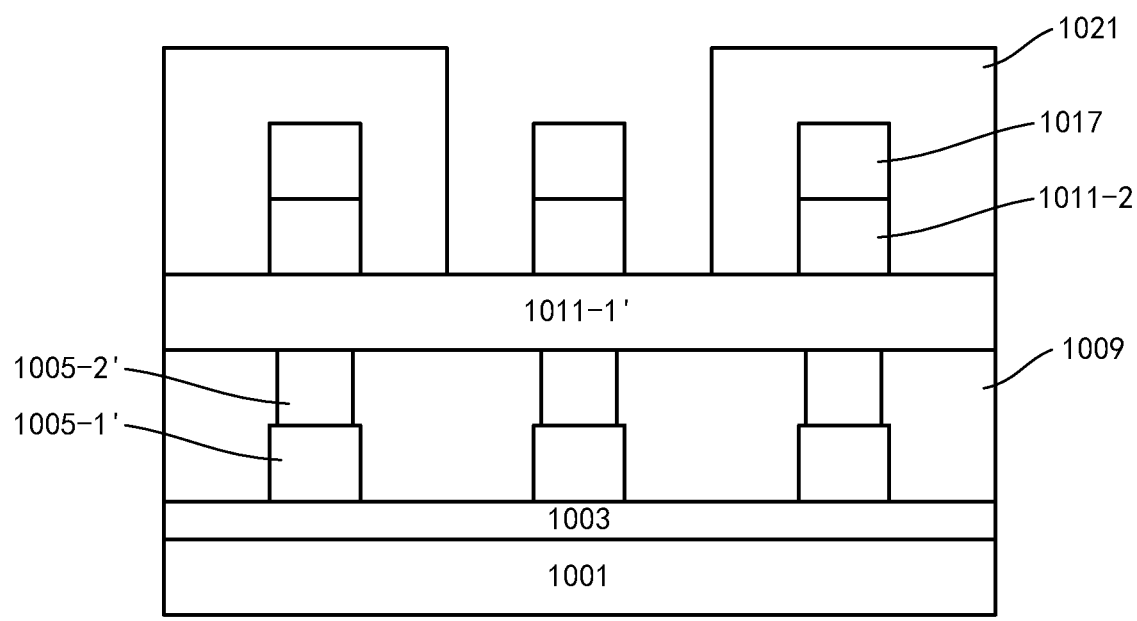
FIG. 14(c) is a cross-sectional view taken along line D-D' in FIG. 14(a)

For example, as shown in FIGS. 14(*a*), 14(*b*), and 14(*c*), a masking layer 1021 may be formed on the structure shown in FIG. 13 (for example, a photoresist or a hard mask formed by patterning a film made of silicon nitride which is a dielectric material), and the masking layer 1021 is patterned, for example, by photoetching to mask areas corresponding to remaining portions of the second via plug material layer need to be kept, and to expose areas corresponding to remaining portions of the second via plug material layer need to be removed. In this example, the remaining portion at a position indicated by the dashed circle in FIG. 14(*a*), for example, should be removed according to the circuit design.

Figure 15A:
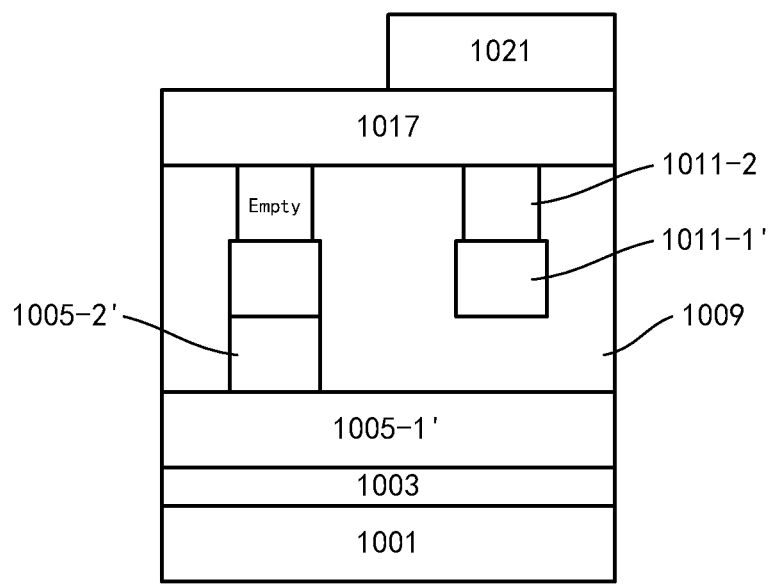
FIGS. 15(a), 16(a), 17(a) are cross-sectional views taken along line B-B' in FIG. 14(a)
Figure 15B:
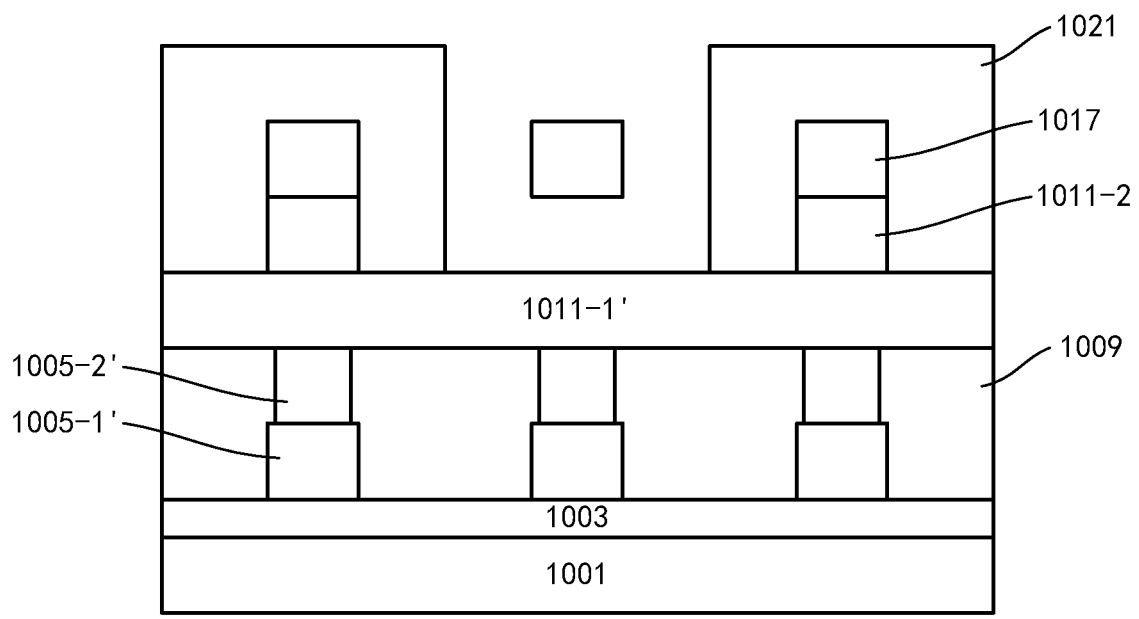
FIGS. 15(b), 16(b) are cross-sectional views taken along D-D' in FIG. 14(a)

The second via plug material layer 1011-2 may be selectively etched through an opening in the masking layer 1021. For example, the second via plug material layer 1011-2 may be selectively etched by using an etching agent which is capable of etching the second via plug material layer 1011-2 (in the example, SiGe) without affecting or substantially without affecting the second interconnection lines 1011-1' (which has been converted into a metal silicide) and the third interconnection line material layer 1017 (in the example, Si). Thus, the remaining portion of the second via plug material layer 1011-2 at the opening in the masking layer 1021 may be removed, as shown in FIGS. 15(*a*) and 15(*b*). According to another embodiment, if the second interconnection line material layer 1011-1 and the third interconnection line material layer 1017 are made of a metal such as tungsten, the second via plug material layer 1011-2 may be selectively etched, for example, by Si isotropic etching which etches Si or SiGe quickly, and etches metals such as tungsten slowly.

Thereafter, the masking layer 1021 may be removed.

Then, as described above in connection with FIGS. 4(*a*) and 4(*b*), the remaining portion of the second via plug material layer 1011-2 and the third interconnection line material layer 1017 may be converted into the low-resistance material (for example, a compound of a metal and a semiconductor element such as silicide (for example, NiSi) or silicon-germanide (for example, NiSiGe)), thereby forming a conductive via plug 1011-2' and a third interconnection line 1017', as shown in FIGS. 16(*a*) and 16(*b*). In another embodiment, if the third interconnection line material layer 1017 is made of a metal such as tungsten, only the remaining portion of the second via plug material layer 1011-2 needs to be converted into the low-resistance material. For example, conventional methods for forming silicide and silicon-germanide may be used. After the formation of silicide or silicon-germanide such as the compound NiSi or NiSiGe, for example, wet etching (for example, dilute aqua regia which etches Ni quickly, and etches tungsten slowly) may be used to remove Ni which has not undergone silicon or silicon germanium reaction.

Figure 16A:
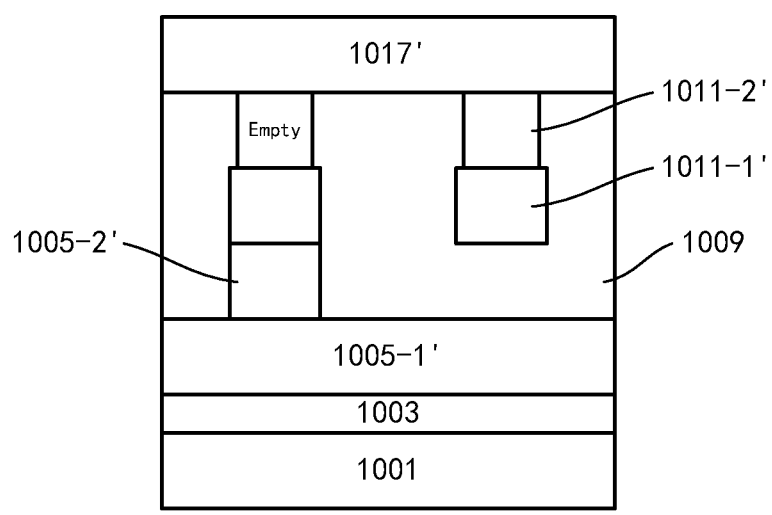
Figure 16B:
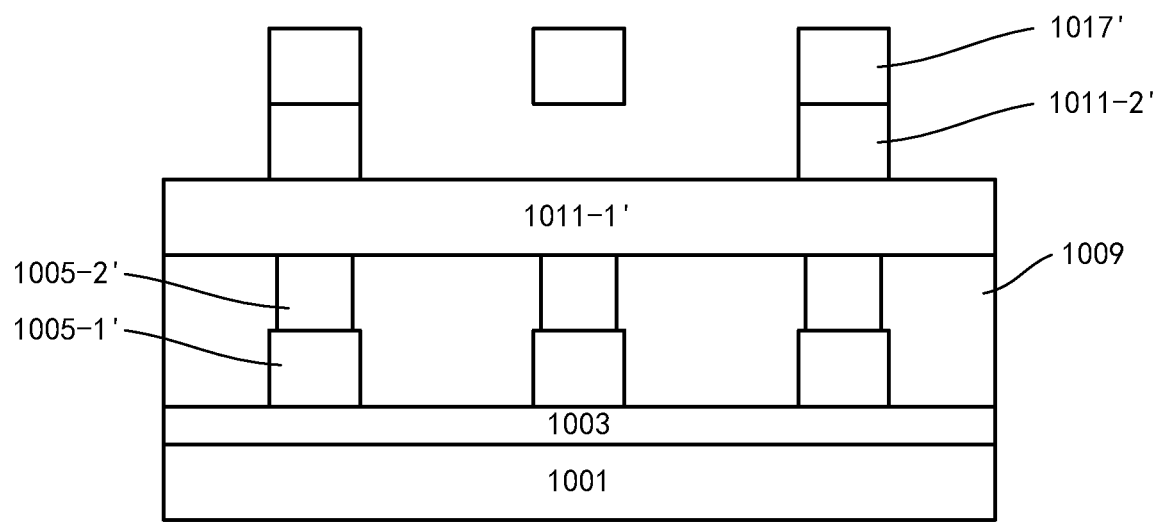

As shown in FIG. 16(a), a pair of sidewalls of the via plug 1011-2' may be defined by corresponding sidewalls of the second interconnection line 1011-1' (e.g., extending approximately in parallel thereto with slight recession due to the protective layer, and even approximately in coplanar therewith if there is no protective layer). Also, as shown in FIG. 16(b), another pair of sidewalls of the via plug 1011-2' may be defined by corresponding sidewalls of the third interconnection line 1017' (e.g., extending approximately in parallel thereto, or even approximately in coplanar therewith). This via plug 1011-2' is self-aligned to the intersection portion of the second interconnection line 1011-1' and the third interconnection line 1017', and electrically connects the second interconnection line 1011-1' and the third interconnection line 1017' to each other.

Figure 17A:
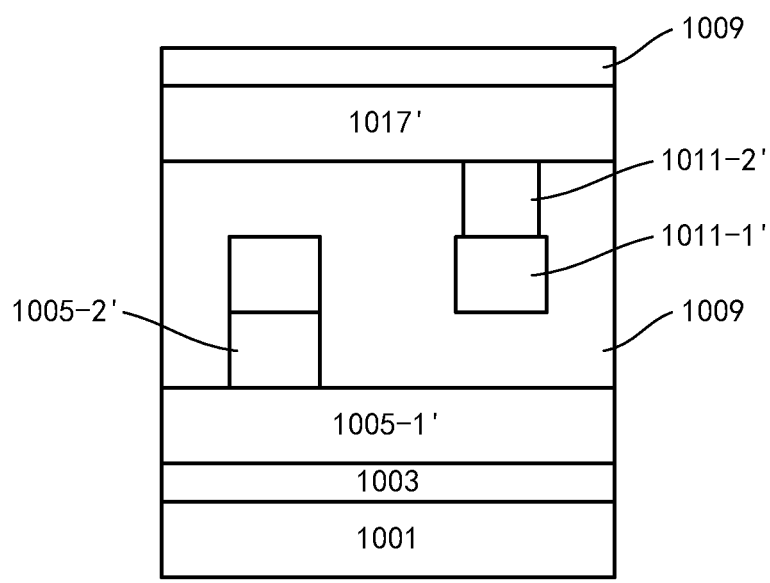
Figure 17B:
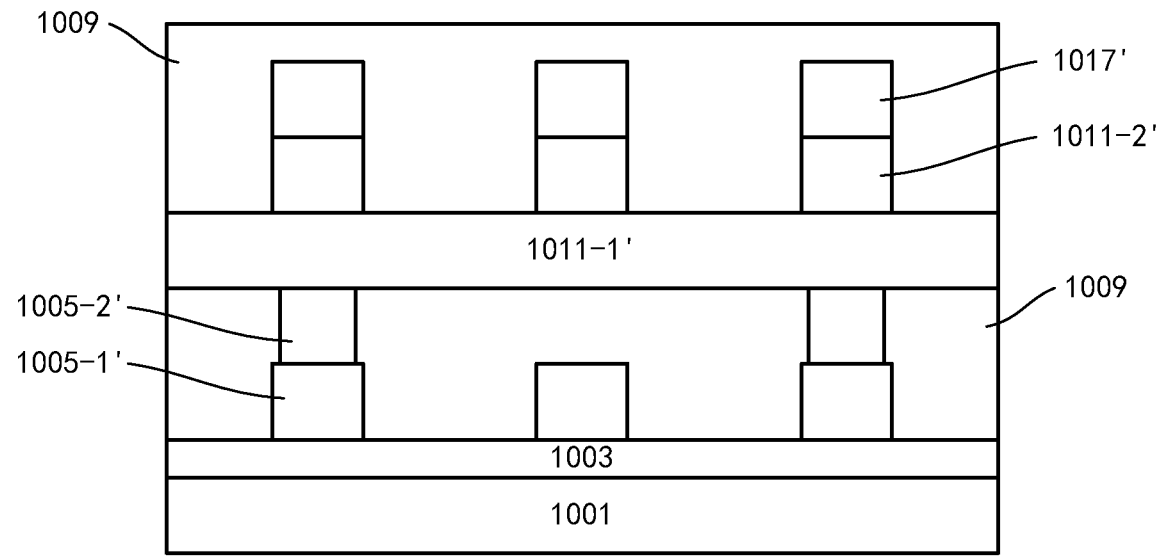
FIG. 17(b) is a cross-sectional view taken along line C-C' in FIG. 12(a)
Figure 17C:
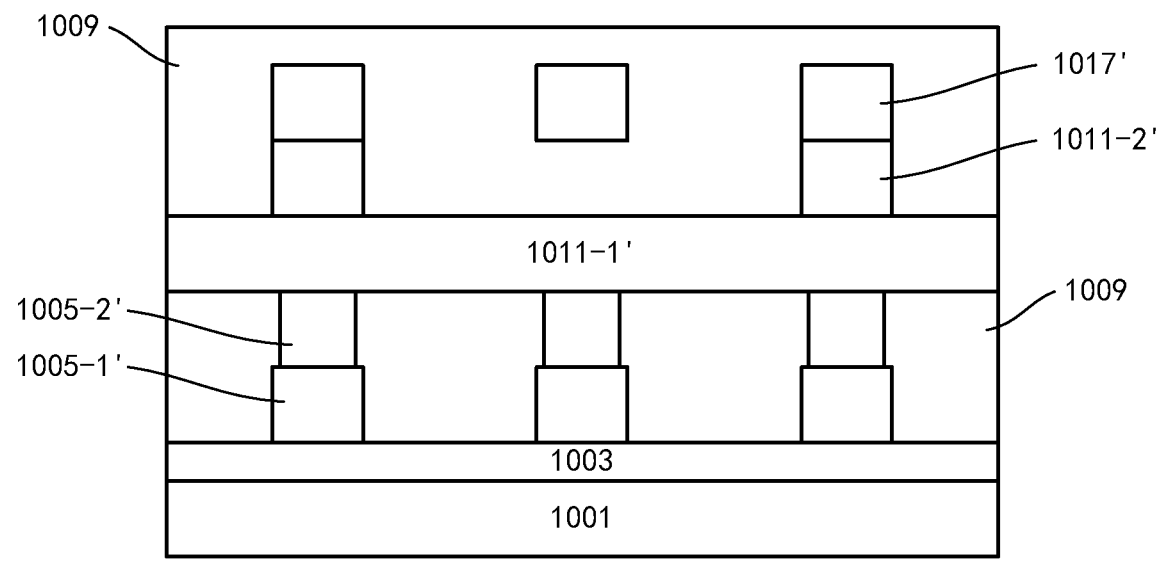

The interlayer dielectric layer may be further raised to bury the formed interconnection line and via plug. For example, as shown in FIGS. 17(a), 17(b) and 17(c), the interlayer dielectric layer 1009 may be raised by, for example, depositing the low-k dielectric material such as oxide (which may be the same material as the interlayer dielectric layer 1009 and thus be integrated therewith). Planarization process such as CMP may be performed on the interlayer dielectric layer 1009.

In this way, the interconnection structure according to this embodiment is obtained. This interconnection structure includes three layers of interconnection lines (1005-1', 1011-1', 1017') and two layers of via plugs (1005-2', 1011-2') disposed between the interconnection lines. As described above, the via plug between two layers of interconnection lines is self-aligned to the intersection portion of the two layers of interconnection lines. Certainly, the present disclosure is not limited to this, but may include more or fewer layers. For example, an increase in layers may be achieved by inserting a pair of interconnection line material layer and via plug material layer and patterning the pair in the manner described above.

Figure 18A:
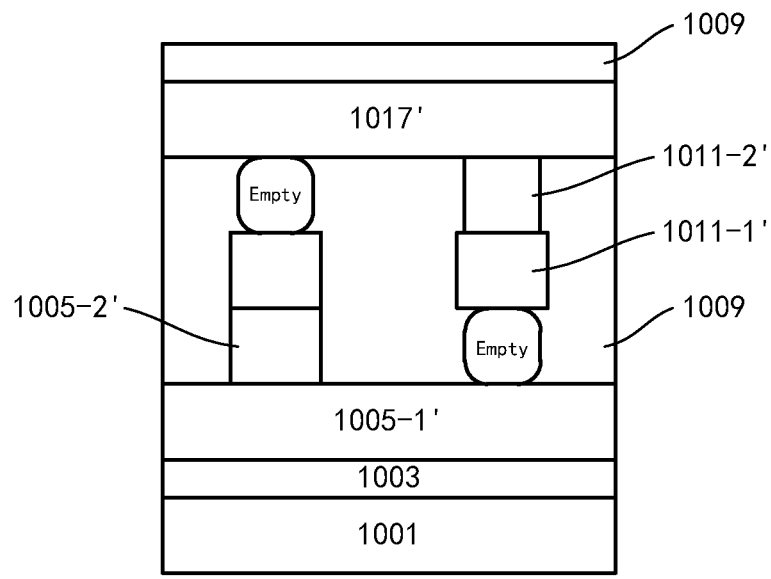
Figure 18B:
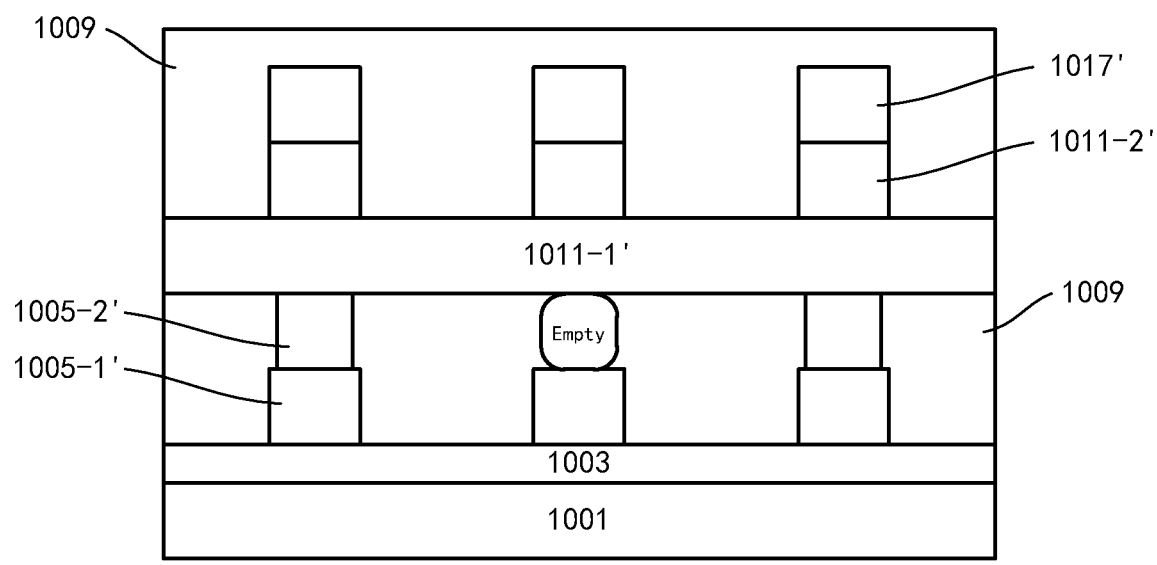
Figure 18C:
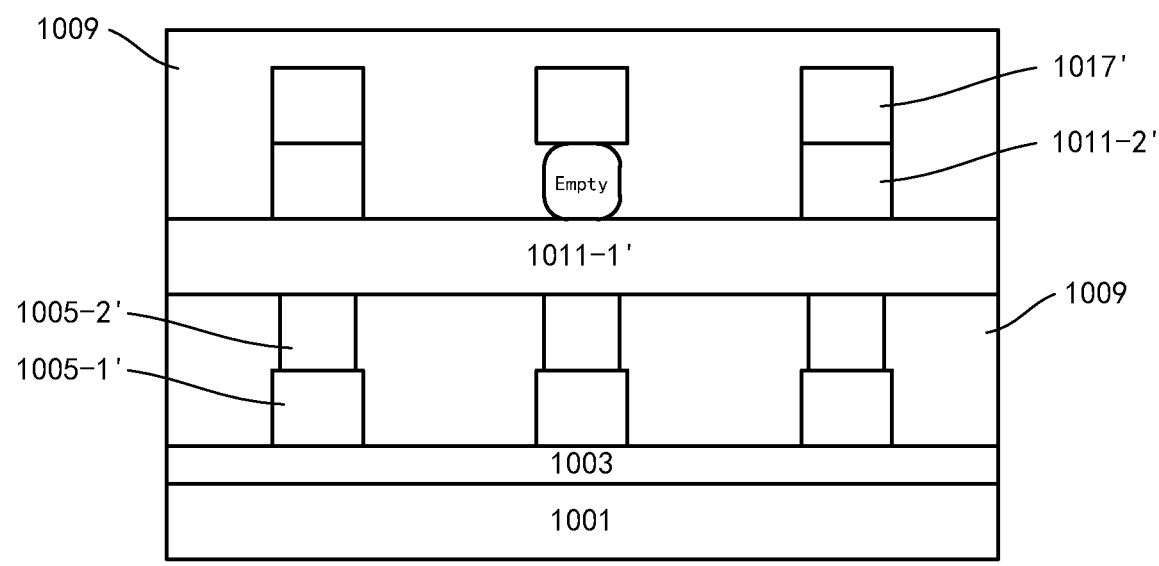

FIGS. 18(a), 18(b) and 18(c) illustrate an interconnection structure according to another embodiment of the present disclosure. The interconnection structure is substantially similar to the interconnection structure shown in FIGS. 17(a), 17(b) and 17(c), except for that a gap or a low-k material is disposed at a position where the interconnection lines intersect but no via plug is disposed. For example, this is obtained by the process shown above in connection with FIGS. 11(a) and 11(b).

Herein, it should be noted that in the above embodiments, the interconnection lines and via plugs are formed by using a semiconductor material and converting it into a low resistance material, but the present disclosure is not limited thereto. For example, the interconnection structure may also be formed directly by a conductive material such as a metal material (which has etching selectivity with respect to its adjacent layer). In this case, for example, the above-mentioned formation and silicidation reaction processes of the protective layer may be omitted. Thus, the sidewalls of the via plug may be substantially coplanar with the corresponding sidewalls of the interconnection lines above and below the via plug, without a recession caused by the protective layer. In addition, the present disclosure is not limited to each of the layers including the low-resistance material converted from the semiconductor material or including a metal material, but some of layers may include the low-resistance material converted from the semiconductor material, while others include the metal material.

The interconnection structure according to an embodiment of the present disclosure may be applied to various electronic devices. For example, after a die including many devices is manufactured through an IC process, the interconnection structure may be formed on the die, and the interconnection structure and the die may be packaged into an IC chip, thereby configuring an electronic device. Therefore, the present disclosure also provides an electronic device including the above interconnection structure. The electronic device may further include components such as a display screen electrically connected to the interconnection structure and a wireless transceiver electrically connected to the interconnection structure. Such electronic devices are, for example, smart phones, computers, tablet computers (PCs), artificial intelligence, wearable devices, mobile power supplies, etc.

According to an embodiment of the present disclosure, a method of manufacturing a system on chip (SoC) is also provided. The method may include the method of manufacturing the interconnect device described above. Specifically, a variety of devices may be integrated on a chip, and the interconnection structure may be manufactured thereon according to the method of the present disclosure.

In the above description, technical details such as patterning and etching of each layer have not been described in detail. However, those skilled in the art should understand that various technical means may be used to form layers, regions, etc. in desired shapes. In addition, in order to form the same structure, those skilled in the art may also design a method that is not completely the same as the method described above. In addition, although various embodiments have been described above, this does not mean that the means used in the various embodiments are not advantageously used in combination.

The embodiments of the present disclosure have been described above. However, the embodiments are for illustrative purposes only and are not intended to limit the scope of the disclosure. The scope of the present disclosure is defined by the appended claims and their equivalents. Numerous alternatives and modifications can be made by those skilled in the art without departing from the scope of the present disclosure, and such alternatives and modifications are intended to fall within the scope of the present disclosure.

I claim:

1. An interconnection structure, comprising:
a first interconnection line at a first level, comprising at least a first portion extending along a first direction;
a second interconnection line at a second level higher than the first level, comprising at least a second portion extending along a second direction crossing the first direction;
a via plug disposed between the first portion of the first interconnection line and the second portion of the second interconnection line, and configured to electrically connect the first interconnection line and the second interconnection line,
wherein the via plug comprises a first pair of sidewalls respectively extending substantially parallel to corresponding sidewalls of the first portion and a second pair of sidewalls respectively extending substantially parallel to corresponding sidewalls of the second portion, wherein the first pair of sidewalls of the via plug is recessed by substantially the same distance with respect to the corresponding sidewalls of the first portion, respectively.

2. The interconnection structure according to claim 1, wherein, in a top view, the via plug is substantially center-aligned with an intersection portion of the first portion and the second portion.

3. The interconnection structure according to claim 1, wherein the second pair of sidewalls of the via plug are respectively substantially coplanar with the corresponding sidewalls of the second portion.

4. The interconnection structure according to claim 1, wherein at least one of the first interconnection line, the second interconnection line, or the via plug comprises a compound of a metal element and a semiconductor element.

5. The interconnection structure according to claim 4, wherein at least part of the semiconductor element in the compound of the metal element and the semiconductor element comprised in the via plug is different from that in the compound of the metal element and the semiconductor element comprised in the first interconnection line and/or the second interconnection line.

6. The interconnection structure according to claim 4, wherein the compound comprises at least one of silicide, germanide, or silicon-germanide.

7. The interconnection structure according to claim 4, wherein the metal element in the compound comprises at least one of Ni, Pt, Co, Ti, or Ru, and the semiconductor element comprises at least one of silicon or germanium.

8. The interconnection structure according to claim 1, further comprising:
a third interconnection line at the first level, comprising at least a third portion extending along the first direction;
a fourth interconnection line at the second level, comprising at least a fourth portion extending along the second direction; and
a gap or a low-k dielectric material disposed between the third portion of the third interconnection line and the fourth portion of the fourth interconnection line, at a position where the third portion and the fourth portion intersect.

9. An electronic device comprising the interconnection structure according to claim 1.

10. The electronic device according to claim 9, further comprising: a display electrically connected to the interconnection structure and a wireless transceiver electrically connected to the interconnection structure.

11. The electronic device according to claim 9, the electronic device comprises a smart phone, a computer, a tablet computer, artificial intelligence, a wearable device or a mobile power source.

12. A method of manufacturing an interconnection structure, comprising:
sequentially forming a first interconnection line material layer and a via plug material layer on an interlayer dielectric layer;
patterning the via plug material layer and the first interconnection line material layer according to a layout of a first interconnection line, to form the first interconnection line from the first interconnection line material layer, wherein the first interconnection line comprises at least a first portion extending along a first direction;
further raising the interlayer dielectric layer to be substantially at the same level with a top surface of the via plug material layer;
forming a second interconnection line material layer on the interlayer dielectric layer; and
patterning the second interconnection line material layer and the via plug material layer according to a layout of a second interconnection line, to form the second interconnection line from the second interconnection line material layer, wherein the second interconnection line comprises at least a second portion extending along a second direction crossing the first direction, such that a via plug is formed from the via plug material layer at a position where the first portion and the second portion intersect.

13. The method according to claim 12, further comprising:
selectively etching a selected via plug with respect to the first interconnection line and the second interconnection line to remove the selected via plug.

14. The method according to claim 13, further comprising:
further raising the interlayer dielectric layer, while at least partially keeping a gap created at the position where the first portion and the second portion intersect due to the removal of the via plug.

15. The method according to claim 12, wherein
the first interconnection line material layer comprises a first semiconductor material, and the via plug material layer comprises a second semiconductor material,
the patterning of the via plug material layer and the first interconnection line material layer comprises:
patterning the via plug material layer according to the layout of the first interconnection line;
forming a protective layer on a surface of the via plug material layer; and
patterning the first interconnection line material layer by using, as a mask, the via plug material layer with the protective layer formed on the surface thereof,
the method further comprises:
with a presence of the protective layer, reacting a metal with the patterned first interconnection line material layer to generate a low-resistance material; and
removing the protective layer.

16. The method according to claim 15, wherein
the second interconnection line material layer comprises a third semiconductor material,
the method further comprises: reacting a metal with the patterned second interconnection line material layer and the via plug material layer to generate low-resistance materials.

17. The method according to claim 16, wherein the first semiconductor material and the third semiconductor material comprise polycrystalline silicon or amorphous silicon, and the second semiconductor material comprise polycrystalline silicon germanium or amorphous silicon germanium.

18. An interconnection structure, comprising:
a first interconnection line at a first level, comprising at least a first portion extending along a first direction;
a second interconnection line at a second level higher than the first level, comprising at least a second portion extending along a second direction crossing the first direction;
a via plug disposed between the first portion of the first interconnection line and the second portion of the second interconnection line, and configured to electrically connect the first interconnection line and the second interconnection line,
wherein the via plug comprises a first pair of sidewalls respectively extending substantially parallel to corresponding sidewalls of the first portion and a second pair of sidewalls respectively extending substantially parallel to corresponding sidewalls of the second portion, wherein at least one of the first interconnection line, the second interconnection line, or the via plug comprises a compound of a metal element and a semiconductor element, and wherein at least part of the semiconductor element in the compound of the metal element and the semiconductor element comprised in the via plug is different from that in the compound of the metal element and the semiconductor element comprised in the first interconnection line and/or the second interconnection line.

19. An interconnection structure, comprising:

a first interconnection line at a first level, comprising at least a first portion extending along a first direction;

a second interconnection line at a second level higher than the first level, comprising at least a second portion extending along a second direction crossing the first direction;

a via plug disposed between the first portion of the first interconnection line and the second portion of the second interconnection line, and configured to electrically connect the first interconnection line and the second interconnection line, wherein the via plug comprises a first pair of sidewalls respectively extending substantially parallel to corresponding sidewalls of the first portion and a second pair of sidewalls respectively extending substantially parallel to corresponding sidewalls of the second portion, a third interconnection line at the first level, comprising at least a third portion extending along the first direction;

a fourth interconnection line at the second level, comprising at least a fourth portion extending along the second direction; and a gap or a low-k dielectric material disposed between the third portion of the third interconnection line and the fourth portion of the fourth interconnection line, at a position where the third portion and the fourth portion intersect.

* * * * *